United States Patent [19]

Breton et al.

[11] Patent Number: 4,780,674
[45] Date of Patent: Oct. 25, 1988

[54] PROCESS FOR IMAGING BY NUCLEAR MAGNETIC RESONANCE

[75] Inventors: Eric Breton, Voisins les Bretenneaux; Denis Le Bihan, Hengenheim, both of France

[73] Assignee: Thomson-Cgr, Paris, France

[21] Appl. No.: 946,034

[22] Filed: Dec. 24, 1986

Related U.S. Application Data

[63] Continuation-in-part of Ser. No. 823,522, Jan. 29, 1986, abandoned.

[51] Int. Cl.[4] .............................................. G01R 33/20
[52] U.S. Cl. ..................................... 324/309; 324/306
[58] Field of Search ................ 128/653; 324/306, 307, 324/308, 309, 310, 311, 312, 313, 314, 300

[56] References Cited

U.S. PATENT DOCUMENTS 4,307,344 12/1981 Walters ................................ 324/309
4,683,431 7/1987 Pattany et al. ...................... 324/306
4,694,253 9/1987 Le Roux ............................. 324/309

OTHER PUBLICATIONS

J. R. Singer, "NMR Diffusion and Flow Measurements and an Introduction to Spin Phase Graphing", J. Phys. E.; Sci. Instr., vol. 11, 1978.

J. E. Tanner et al., "Restricted Self Diffusion of Protons in Colloidal Systems by the Pulsed-Gradient, Spin-Echo Method", J. Chem. Phys., vol. 49, No. 4, Aug. 15, 1968.

*Primary Examiner*—Stewart J. Levy
*Assistant Examiner*—Lawrence G. Fecs
*Attorney, Agent, or Firm*—Oblon, Fisher, Spivak, McClelland & Maier

[57] ABSTRACT

The invention proposes an imaging process by nuclear magnetic resonance in which a calculated image is given corresponding to the molecular diffusion value at each point of an investigated medium. The diffusion image is obtained by comparing images relative to same sections of the medium and acquired during two excitation sequences, whereof one is not very sensitive to the diffusion and the other is particularly sensitive thereto. These two images undergo comparison in order to produce a diffusion image.

24 Claims, 7 Drawing Sheets

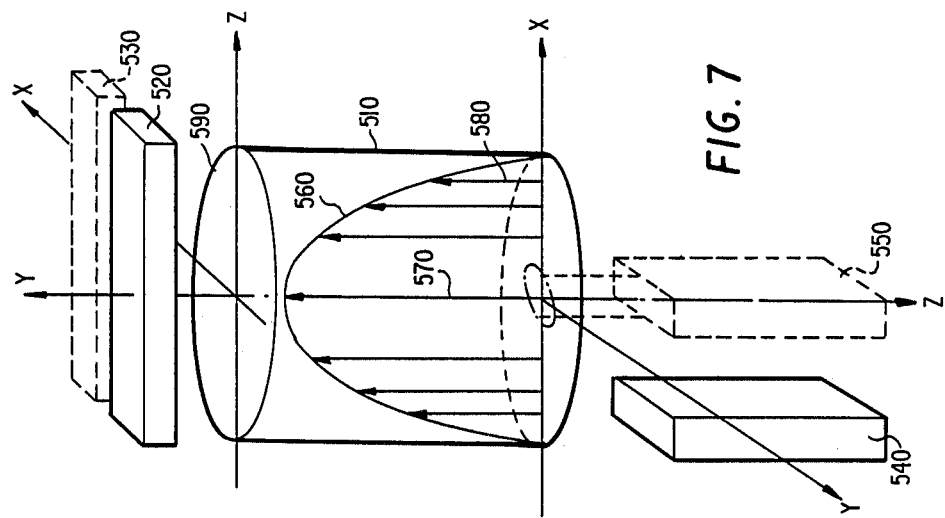
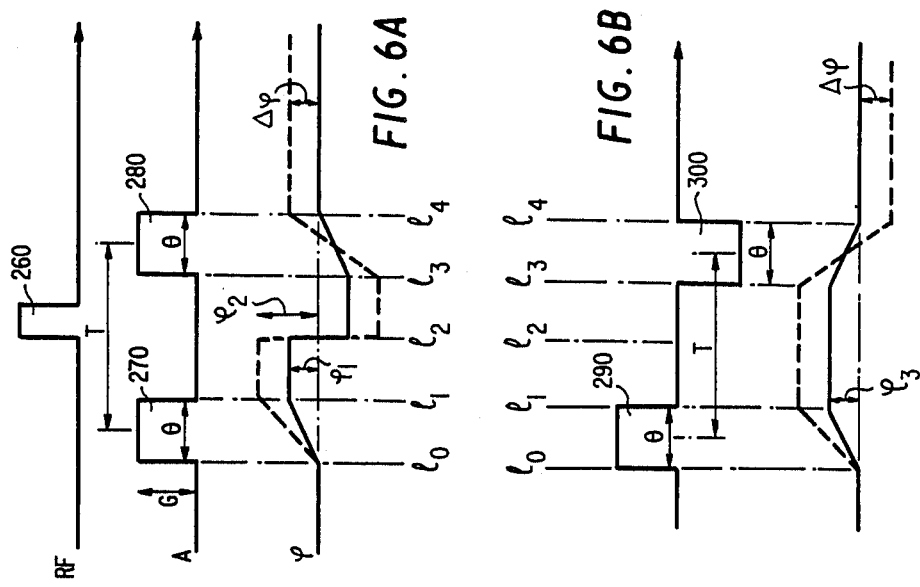

PROCESS FOR IMAGING BY NUCLEAR MAGNETIC RESONANCE

CROSS REFERENCE TO RELATED APPLICATION

This application is a continuation-in-part of U.S. application Ser. No. 823,522, filed Jan. 29, 1986, now abandoned.

BACKGROUND OF THE INVENTION

1. Field of the Invention

The present invention relates to an imaging or image formation process by nuclear magnetic resonance. The use of this process is more particularly intended in the medical field for representing sections of organs of the human body.

2. Discussion of Background

Nuclear magnetic resonance imaging has mainly been developed as a means of medical diagnosis. It makes it possible to display internal tissue structures with a contrast and resolution of a quality not hitherto achieved with other imaging processes. In order to obtain an image by nuclear magnetic resonance of an organ section with differentiation of the tissue characteristics of the organ, use is made of the property of certain atomic nuclei, such as protons, of orienting their magnetic moment whilst acquiring energy when placed in a main constant magnetic field $B_0$. A particular zone of an object containing nuclei then has an overall magnetic moment, which can be flipped in accordance with a given orientation, perpendicular or parallel to field $B_o$, by inducing a resonance by the emission of a radio frequency field perpendicular to the main field.

All the particles which then have a magnetic moment rotating at a so-called Larmor precession speed tend to find again the initial orientation parallel to $B_o$ by emitting a radio frequency signal at the characteristic resonant frequency of $B_o$ and of the nucleus. This signal can be detected by a receiving antenna. The duration of the return to equilibrium of the overall magnetic moment of a considered region and the decrease of the signal are dependent on two important factors, namely the spin-system interaction and the spin-spin interaction of the particles with the surrounding material. These two factors lead to the definition of two relaxation times, called respectively $T_1$ and $T_2$. A considered region of an object thus emits a signal, whose intensity is dependent on $T_1$, $T_2$, the proton density of the region and the time which has elapsed since radio frequency excitation.

In order to locate a region of the organ, it is necessary to establish the nature of its emission as a function of the local conditions of the magnetic field. These local conditions are imposed in such a way that the frequency and the phase of the emission are characteristic of the location in space of said region of the organ. For this purpose, pulsed magnetic field gradients are superimposed on the main field $B_o$. These gradients are oriented in directions X, Y and Z in order to define, at all times, the volume elements which resonate at known frequencies. For obtaining a complete picture, the local conditions are imposed in programmed sequences, which are stored in a master computer. These sequences define the application times of the gradients, the excitation times of the nuclei by the radio frequency field pulses and the reading or acquisition times of the image data.

Another factor intervenes to modify the intensity of intercepted signal when the nuclei return to their equilibrium orientation. This other factor depends upon the molecular diffusion or scattering of the medium. The molecular diffusion relates to the displacements undergone by the molecules of a medium as a function of time. The inhomogeneity of the magnetic field in which these molecules are located then has the effect that the magnetic resonance frequency of these molecules changes. Thus, this frequency is linked with the gyromagnetic ratio of these molecules at the intensity of said field. Furthermore, during a magnetic resonance experiment, particularly one with a sequence of spin echoes, the intercepted signal is below the expected intensity.

Thus, the frequency of occurrence of the molecules of the region of the space where the magnetic fields differ has the effect of modifying the relative phases of the contributions made by each of these molecules to the intercepted overall magnetic resonance signal. As the displacements of the molecules are in all directions, the phase dispersion resulting therefrom has the effect that certain contributions are mutually opposed. The intercepted signal is then weaker. This sensitivity loss to a certain extent represents the diffusion characteristic of a medium and a highly diffusing medium is subject to a very rapid decrease in its magnetic resonance signal with the echo time used.

In human organs there are pathological tissues, e.g. angiomas and tumors having often identical standard nuclear magnetic resonance signals. In other words, the images of these organs show the relaxation times $T_1$ or $T_2$ and do not make it possible to discriminate these conformations. Thus, the examination of the standard image does not make it possible to make a therapeutic decision. Thus, the aim of the present invention is to propose images where the parameter shown is the molecular diffusion characteristic in the studied tissues, in order to improve their differentation.

DESCRIPTION OF THE PRIOR ART

The book "Biomedical Magnetic Resonance", published by Radiology Research and Education Foundation, San Francisco 1984 contains an article by George Wesbey et al and entitled "Translational Molecular self-diffusion in Magnetic Resonance Imaging: Effects and Applications". This article suggests measuring the diffusion constant of the regions of a medium by comparing the relative effect of the diffusion on the studied medium and on a standard substance during different magnetic excitation sequences. In the description given of this method, a disadvantage appears. Thus, these sequences are obtained by increasing the intensity of a sections selection gradient, which modifies the thickness of the studied section. This method then only applies to objects which are finer then the finest section thickness obtained by the sequences used, so that it is not usable in man. Moreover, the sensitivity of this method to diffusion is relatively limited (short echo times, ineffectively placed gradients in the sequence), so that the authors use several acquisitions for obtaining a reasonable accuracy regarding the measurement. Further, it is necessary to use the same standard to act as a reference for the measurements.

SUMMARY OF THE INVENTION

The present invention makes it possible to establish a diffusion image whilst avoiding these disadvantages. In particular, the images have a constant thickness section, which makes it possible to carry out acquisitions on man, even with a multisection process. The sensitivity to diffusion is good and is due to the use of a relatively long echo time and effective gradients as a result of their intensity and position. Moreover, the exact determination of diffusion coefficients is obtained without a standard substance. In the invention, the absolute effect of the diffusion has been calculated from acquisition parameters.

The present invention therefore relates to a process for imaging by nuclear magnetic resonance, wherein it comprises the following stages for giving an image of the molecular diffusion of an investigated body:

the body is placed in a constant magnetic field $B_o$;

the thus positioned body is subject to a first plurality of first spin echo excitation sequences in the presence of first field gradient sequences, said first spin echo sequences having an integral number N equal to or greater than one of excitations where the magnetic moments of the nuclei of the body are flipped by 180° following an excitation in which said moments have been flipped by 90° to obtain in this way sequences with N slightly diffusing echoes;

the magnetic resonance signals are recorded at the end of these first sequences and a first image is calculated corresponding to echo N of these signals by allocating to each point of the image a value corresponding to the magnetic resonance signal of the point corresponding thereto in the body;

the thus positioned body is subject to a second plurality of second spin echo excitation sequences in the presence of second field gradient sequences, said second spin echo sequences having a 180° excitation following a 90° excitation for forming diffusing echo sequences, the echo duration of the second excitation sequences being equal to the total echo duration of the first excitation sequences;

the magnetic resonance signals are recorded at the end of said second excitation sequences and a second image is calculated corresponding to the echoes of these signals by allocating to each image point a value corresponding to the magnetic resonance signal of the point corresponding thereto in the body;

there is a point-by-point comparison of the values allocated for the first image with the values allocated for the second image, in order to produce a third image representing the molecular diffusion at each point of the body.

BRIEF SUMMARY OF THE DRAWINGS

The invention is described in greater detail hereinafter relative to non-limitative embodiments and the attach drawings, in which the same references designate the same elements throughout and wherein show:

FIGS. 6a and 6b. time diagrams of the resulting phase displacements, following application of interfering magnetic field sequences between the contributions emitted by fixed particles and moving particles.

FIG. 7. a diagrammatic representation of the response part of a medium, whose particles are displaced as a function of whether said displacement is parallel or perpendicular to an imaged sectional plane.

DESCRIPTION OF THE PREFERRED EMBODIMENTS

Figure 1:
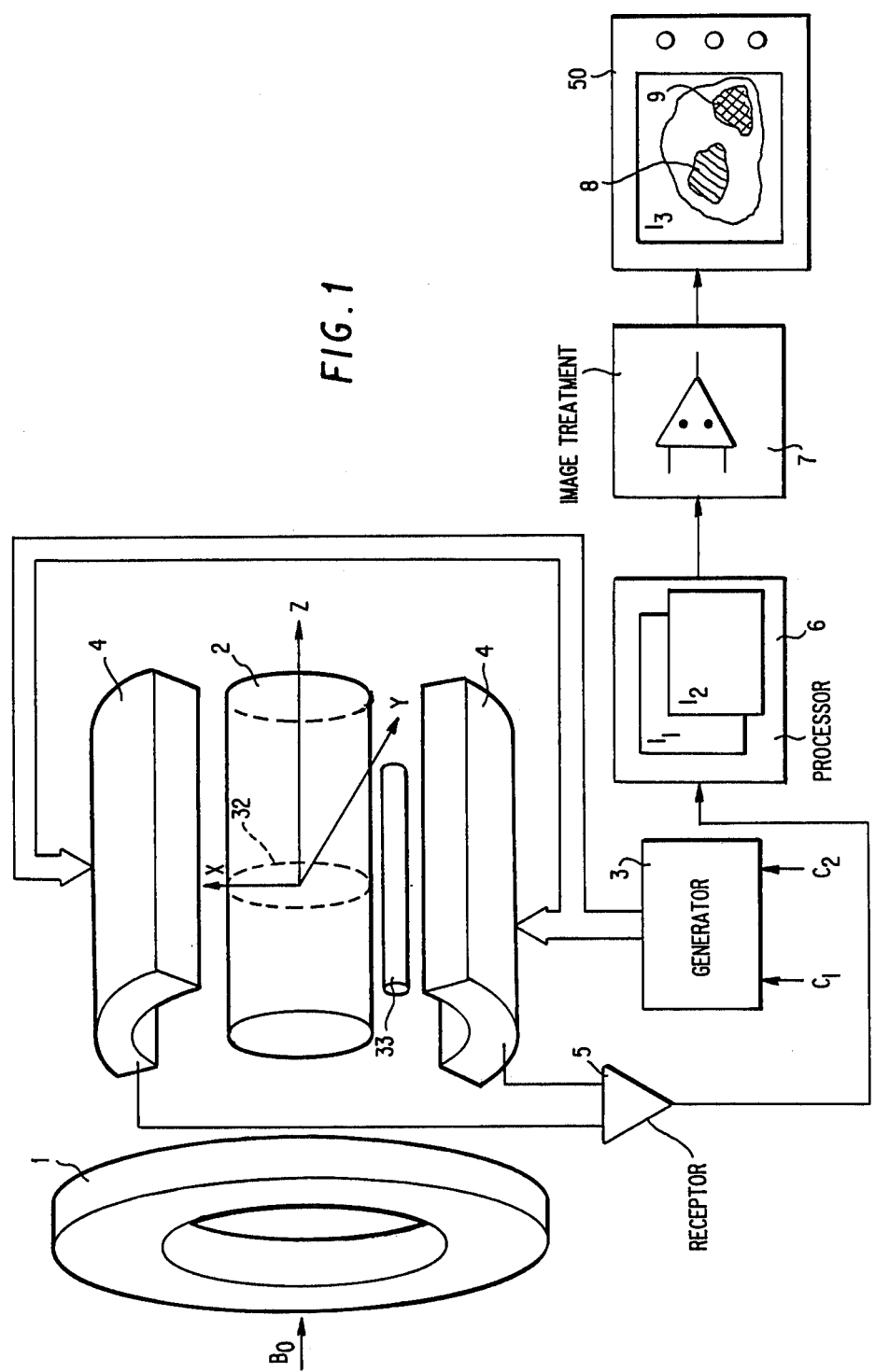
FIG. 1. a device suitable for performing the imaging process according to the invention.
Figure 2A:
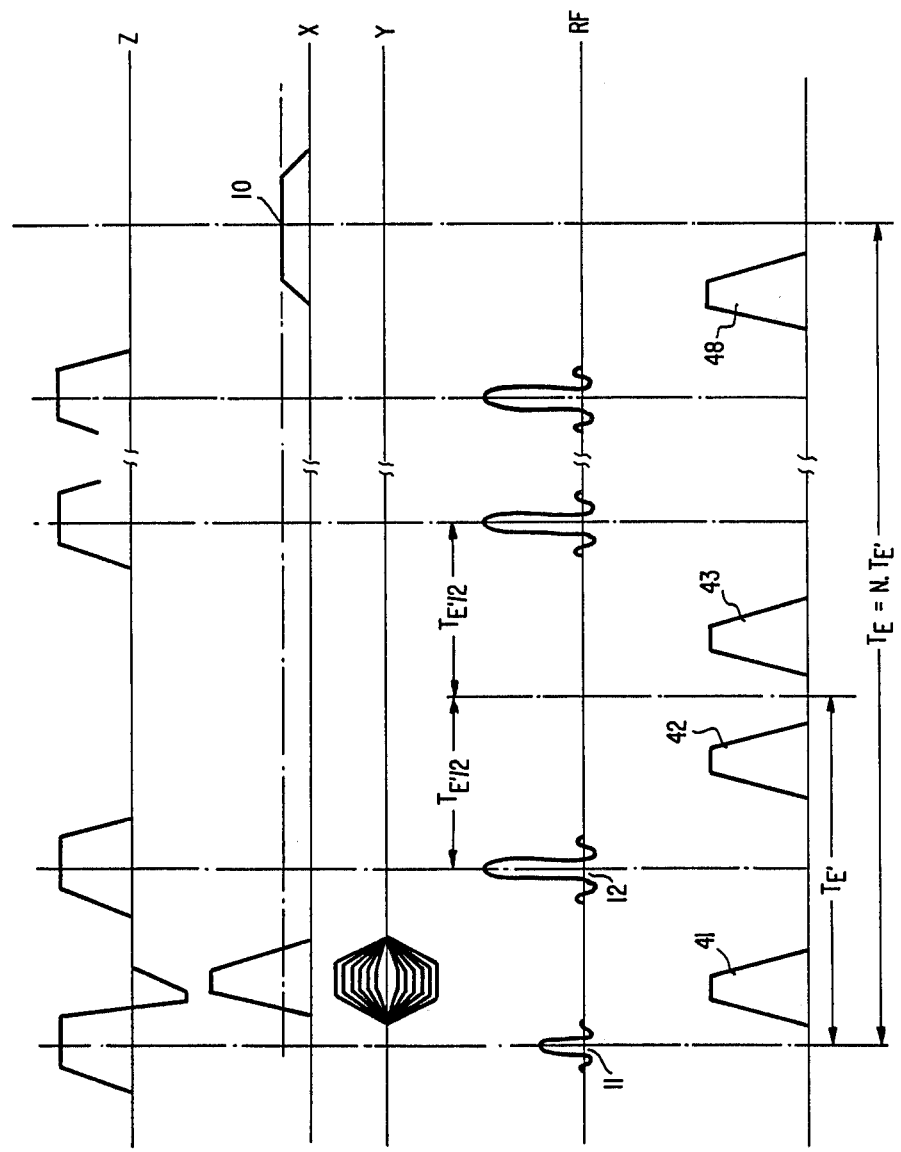
FIG. 2a. time diagrams of the field gradient and excitation sequences applied to the body for producing the first and second images.

FIG. 1 shows a device for performing the imaging process according to the invention. This device incorporates means symbolized by a coil 1 for subjecting a body 2 to a high constant magnetic field $B_o$. This device also has generating means 3 and coils 4 for subjecting the thus positioned body to spin echo sequences with one or more echoes in the presence of field gradient sequences (FIG. 2a). Coils 4 represent radio frequency coils and field gradient coils. It also has reception means 5 connected to the coils 4 for receiving the magnetic resonance signal and means 6 for calculating and storing a first image $I_1$ and a second image $I_2$ relative to two series of experiments imposed by controls $C_1$ and $C_2$ of the generating means 3. In comparison means 7, a point-by-point comparison is made of images $I_1$ and $I_2$ by calculating the logarithm of the ratio of values representing the magnetic resonance signals. The means 7 then produce a third image $I_3$, in which two regions 8 and 9 of the medium at the location of the imaged section have different diffusion value responses, whereas they could have had identical responses in standard magnetic resonance image. These images can be displayed on a visual display 50.

The process for calculating images $I_1$ or $I_2$ is of a conventional nature. In an example, the imaging method used by means 6 is a so-called 2 DFT method. This imaging method makes it possible to obtain at present the best image quality. In this method only one sectional plane is excited at the same time by the radio frequency excitation means (90° or 180°) of a particular form and in the presence of a so-called selection gradient. In FIG. 1, the selection gradient can be oriented along axis Z to select a cross-section i.e. in accordance with a plane X, Y. The principle of 2 DFT imaging is the phase coding of the different signals acquired. This is obtained by a pulse having a variable intensity with a so-called phase shift gradient, whose axis is perpendicular to a reading gradient, whose direction is constant. For example, for a cross-section, the reading gradient could be gradient X and the phase shift gradient Y. Then by a double spatial Fourier transform, the image is constructed hence the name of the method. A description is given of this imaging procedure in the book "Imagerie par resonance magnetique", M. LE BIHAN, published by Editions MASSON, Paris, March 1985. An improvement to this method can make it possible to simultaneously obtain the images of several parallel sections.

FIG. 2 shows field gradient sequences along the three axis Z, Y and X, as well as the times of applying radio frequency excitations tending to flip the spins of the nuclei by 90° for small excitations and 180° for large excitations. For the purpose of imaging a section of body, spin echoe excitation sequences have to be performed in the presence of field gradient sequences and the number thereof must be large enough to ensure that the resolution of the expected image is more precise. At each excitation sequence, the phase shift gradient Y varies by successive steps starting from a certain value and extending up to the same value, but with a different sign. This value is dependent on the shape and duration of reading gradient 10. This phase shift gradient makes it possible to rotate each spin by a variable phase, dependent on its ordinate along axis Y and the value of said gradient. For each image $I_1$ and $I_2$, gradient Y can successively assume the same number of values and in a preferred manner the definition of the two images is the same.

What differs in the invention between the first image $I_1$ and the second image $I_2$ is the number of spin echo radio frequency excitation sequences and/or the intensity and shape of the gradient sequences. The calculation performed by comparison means 7 is linked with the way in which the images have been acquired and with the information content of said images. In the first spin echo excitation sequences, N excitations 12 of 180° succeed a single excitation 11 of 90°. The number N is equal to or greater than 1. In the second spin echo excitation sequences, there is only a single 180° pulse, which follows the 90° excitation. Moreover, the duration of the echo time $T_E$ of the second sequence of spin echo excitations is equal to the N durations of echo time $T_{E'}$ of the first sequence of spin echo excitations. For reasons of simplicity in the first spin echo sequences, the successive echo times are equal to one another. It is easier to divide a given duration $T_E$ into an integral number of equal elementary durations $T_{E'}$. However, if the successive echo times $T_{E'}$ of the fist spin echo sequences are not equal to one another, it is still possible for the invention to function; it being important for the duration between the 90° pulse 11 and the measuring time 10 to be the same in both cases.

Figure 3A:
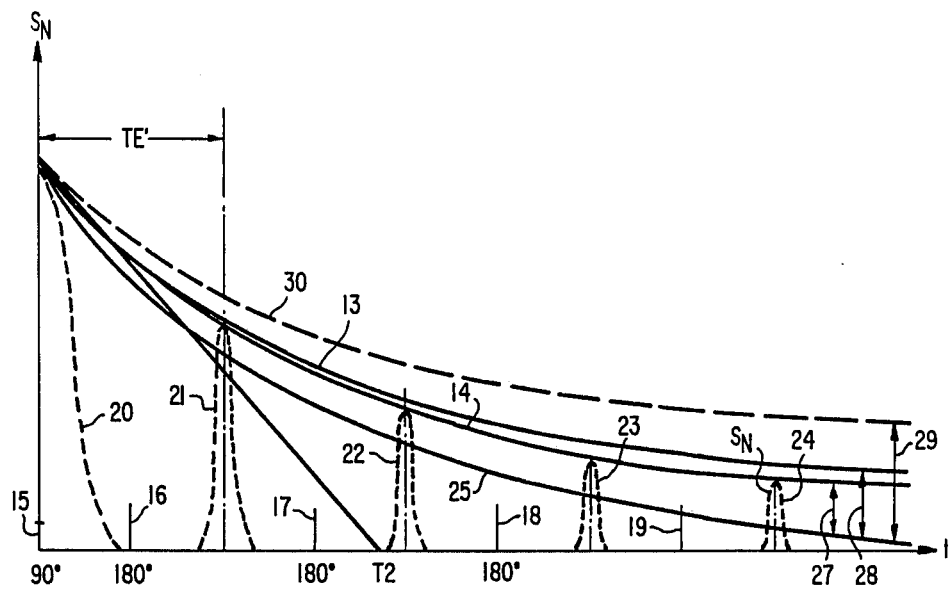
FIGS. 3a and 3b. the paths of the signals recorded respectively at the end of the first and second excitation sequences.
Figure 3B:
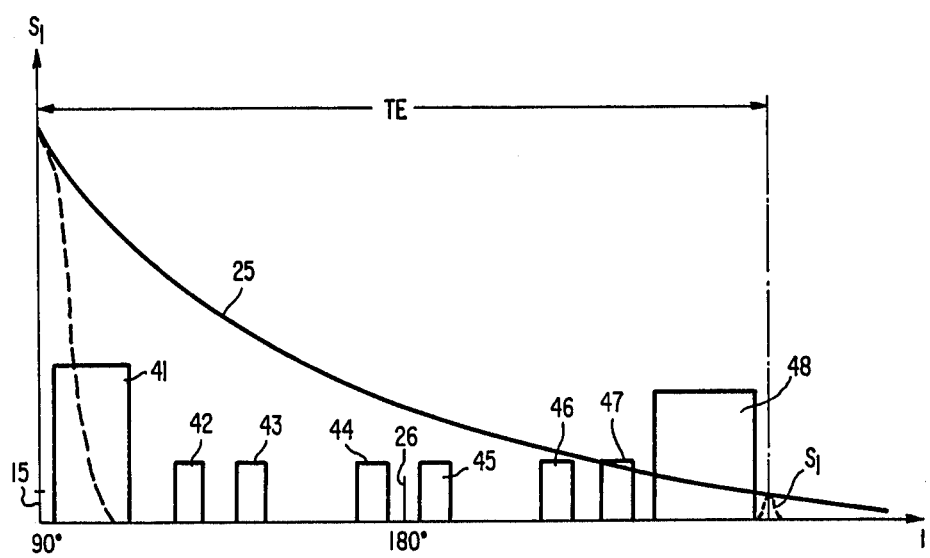

In the example shown in FIG. 3a, the first spin echo sequence has four equal echo times $T_{E'}$, in the centre of which there is a 180° pulse on each occasion. In FIG. 3b, during a same duration $T_E$ a single 180° pulse 26 is interposed. In an example, time $T_E$ is equal to 112 milliseconds and time $T_{E'}$, 28 milliseconds. In this example, the repetition time TR, which is the time separating for either image each spin echo sequences during which gradient Y assumes a different value, is equal to 1 second. The value of 112 milliseconds is made sufficiently large to obtain a good sensitivity on the diffusion effect and a reasonable signal-to-noise ratio. Such excitation-measurement sequences can be brought about by controls $C_1$ and $C_2$, which are dependent on the machines used.

Figure 2B:
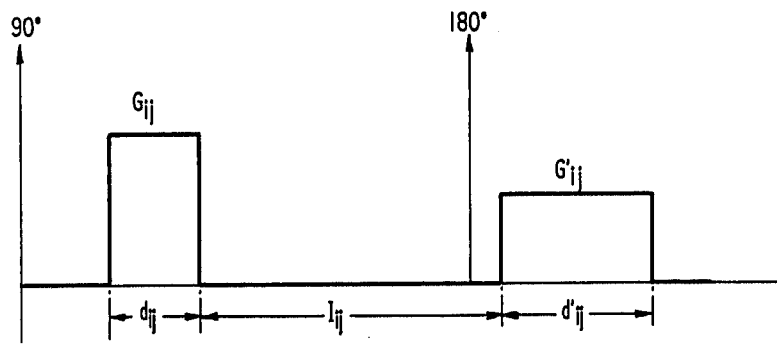
FIGS. 2b and 2c. time diagrams of so-called compensated homologous gradients, used for increasing the sensitivity to the diffusion effect.
Figure 2C:
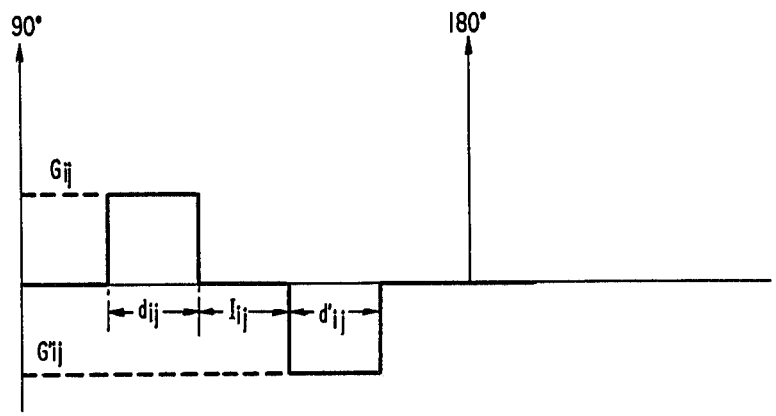

In the invention, it has been found that the contribution of part of the medium to the magnetic resonance signal recorded at the end of the echo time $N.T_{E'}$ in a first excitation sequence is in the following form:

$$S_N(N \cdot T_{E'})_N = f(\rho, T_1, T_2, NT_{E'}, TR) \cdot \exp\left(-\gamma^2 D \sum_{j=1}^{N} \sum_{i=1}^{m} W \right)$$

$$\text{where } W = G_{ij} d_{ij} \left( \frac{d_{ij} + d'_{ij}}{3} + I_{ij} \right)$$

in which $f = \rho \cdot e^{-\frac{NTE}{T2}} \left( 1 - e^{-(\frac{TR - N \cdot TE}{T1})} \right)$ In these expressions $\rho$ is the proton density at the considered location, $\gamma$ is gyro magnetic ratio of the molecules of the medium at said location and $G_{ij}$ and $d_{ij}$ correspond to a pair of compensated homologous gradients, like those shown in FIG. 2b or 2C. A pair of compensated homologous gradients corresponds to a pair of gradients of intensity $G_{ij}$ and $G'_{ij}$ and durations $d_{ij}$ and $d'_{ij}$, so that $G_{ij}.d_{ij} = G'_{ij}.d'_{ij}$. If the gradients are placed on either side of a 180° radio frequency excitation pulse, intensities $G_{ij}$ and $G'_{ij}$ are the same sign. However, if the gradients are placed on the same side, they are of opposite sign. The sums relate to the number m of compensated homologous pairs of gradient pulses and the number N of spin echoes. For example, in FIG. 3b, there are four compensated homologous pairs of gradient pulses to which, for calculating m, it is necessary to add the compensated homologous gradient pairs of corresponding to a normal imaging sequence. For the second excitation sequence $N.T_{E'}$ is replaced by $T_E$ and N is replaced by 1. Parameters $G_{ij}$, $d_{ij}$ and m are then different therein. In this case, the signal is $S_1(T_E)$. The contributions of a point of the medium are supplied in the magnetic resonance signal in common with the contributions of the other points of the examined section in the medium. The 2 DFT imaging method makes it possible to definitively allocate to each point of the images $I_1$ or $I_2$ a value representative of these contributions.

FIG. 3a represents by the envelope curve 13 the theoretical signal resulting from the existence of a relaxation time $T_2$ when all the other parasitic effects, including the diffusion, can be ignored. Curve 14 shows what happens to this theoretical curve when it is measured with so-called slightly diffusing sequences, i.e. when the diffusion effect is not very noticeable. This effect can be noticed if number N is sufficiently high for a given time $T_E(=NT_{E'})$, e.g. it is equivalent to 4 here. Thus, in the contribution formula, the higher N, the smaller the coefficients $d_{ij}$ and $I_{ij}$ and the weaker the diffusion effect. The radio frequency excitations designated 15 to 19 in FIG. 3a involve an excitation tending to make the nuclei of the flip by 90° (excitation 15) and four successive excitations tending to flip these nuclei by 180° (16 to 19). The dotted line signal 20 is the nuclear magnetic resonance signal following the first 90° excitation. The peaks 21 to 23 of this signal, measured after successive echo time periods $T_{E'}$, follow curve 14. Signal $S_N$ of the preceding formula corresponds to the amplitude of peak 24.

FIG. 3a also shows the envelope 25 of these peaks when the body is subject to diffusing sequences. Curve 25 is also plotted in FIG. 3b. In a diffusing sequence, a single 180° excitation 26 follows the 90° pulse 15 and the signal measured at the end of echo time $T_E$ is $S_1$. The value of this signal is given by a formula identical to the preceding formula, the only difference resulting from the fact that in this case N=1. On examining these two drawings, it is apparent that it is possible by comparing an image $I_1$, relative to peaks following envelope 14, with an image $I_2$, relative to peaks following a curve 24, to represent an image $I_3$ relative to the difference or variation 27 between these two curves. To the extent that the slightly diffusing sequence can be increasingly less diffusing, curve 14 moves towards curve 13. This makes it possible to represent an image, in which the diffusion effect 28 only can be better revealed. It is useful to note that the third image with the process according to the invention differs from the teaching given in the aforementioned document. With that teaching, the signal is proportional to a variation 29 between the effects of the diffusion in the studied body and a standard body, whose diffusion response is entered in the broken line curve 30.

According to the invention, the ratio of signals $S_N$ and $S_1$ is formed and the logarithm of said ratio is taken. It is thus possible to produce a representative signal (point-by point in the image) corresponding to the following formula:

$$\text{Log}\left(\frac{(S_N)}{S_1}\right) = D[b_{1m} - b_{Nm}] = KD$$

with $$b_{km} = \gamma^2 \cdot \sum_{j=1}^{j=k} \sum_{i=1}^{i=m} \left( G_{ij}^2 \cdot d_{ij}^2 \left( \frac{d_{ij} + d'_{ij}}{3} + I_{ij} \right) \right)$$

where D is the molecular diffusion constant.

This formula shows that the thus performed processing on $S_N$ and $S_1$ gives, to within a factor K, the measurement of the diffusion constant at the considered location in the image. However, this ratio only gives the above result to the extent that, on the one hand the sampling times of the signals $T_E$ and $N.T_{E'}$ are equal to one another and on the other hand where the repetition time TR is the same for the sequences with N echoes and for those with one echo. The function f then takes on the same value for the two sequences and it disappears in the calculation of image $I_3$, where only the diffusion effect appears.

In order that the diffusion effect can be noticed in curve 25, it is of interest to have an echo time $T_E$ in both sequences which are sufficiently long and/or to use greater and longer gradients than in the standard sequence. It is in particular possible to use supplementary gradients 41 to 48 with a maximum spacing from the 180° radio frequency excitation pulses outside the periods during which the radio frequency excitations are applied or received. However, in order that the diffusion effect in the non-diffusing sequence minimized, it can assume a sufficiently large number N and N=4 would appear to be adequate.

A supplementary gradient is shown in FIG. 2a below the radio frequency excitation graph. It can be applied to any one of the axes X, Y or Z. For example, it can be applied to the selection or phase coding axis. When applied to the selecton axis, it does not interfere in the thickness of the selected section in the body to the extent that its supplementary application takes place outside the application times of the radio frequency excitations during which the selection gradient is present. Thus, if the selection gradient receives a value supplement during the 90° selection excitations and the 180° return, it will lead to a greater inhomogeneity. For the same given pass band of the excitation, the thickness of the excited section in body 2 will be finer and the signal restored by this finer section will be weaker. If it is wished that it should be just as strong, it is necessary to increase the excitation pass band and this process then cancels out the simplicity of the method. In a preferred manner, the supplementary gradient is applied as a supplement of the reading gradient. In a preferred manner, everything else being equal, it will be ensured that the gradients will be added at periods which are as remote as possible from those when flip excitations, i.e. excitations 12 are applied.

FIG. 3b gives an idea of the times during which it is possible to apply field gradient supplements 41 to 48 in a preferred manner. They are applied outside the times during which the peaks of the nuclear magnetic resonance signal are recorded. In the representation, gradients 41 and 48 are asymmetrical. However, as they are compensated homologs compared with the flip pulse 26, their integrals with respect to time are equal. The large pulses 41 and 48 can be used alone and are as remote as possible from excitation 26.

The choice of the axis on which the supplementary pulses of the gradients are applied may be indifferent. If it is considered that the molecular diffusion is an isotropic phenomenon, this is effectively the case. However, if it is considered that the molecular diffusion can in certain cases be anisotropic, it can be of interest to choose the axis on which the diffusion effect is to be aided. In particular, certain human body tissues have a preferred orientation as a result of their location in the body. This preferred orientation results from a preferred form of the cells forming them. These cells which have no reason for being symmetrical on three axes then have different molecular diffusion coefficients in each of the three axes. By comparing the molecular diffusion images obtained according to the process of the invention and the field gradient supplements applied along one axis and then along another axis, it can be subsequently possible to determine what type of tissue is involved.

The measurement of the given diffusion in the third image is a quantitative measurement on the basis of the calculation of the coefficients $b_{km}$ (k being equal to 1 or N according to the sequences) and consequently of the factor K. However, the imperfections inherent in the imaging systems can lead to an overall attenuation of the signals $S_n$ or $S_1$ at each point of the image, e.g. slightly different section thickness, poor rephasing of the section selection of one of the two images, etc. This overall attenuation can be calibrated with the aid of a standard substance 33 position along the studied body, so that it appears on the edges of the image field. If $Se_N$ and $Se_1$ are magnetic resonance signals in the standard substance, corresponding to signals $S_N$ and $S_1$ in the studied substance, respectively at the end of slightly diffusing and diffusing sequences, it is possible to write that the molecular diffusion coefficient of a point in the section is equal to:

$$D = \frac{1}{K}\left( \text{Log}\frac{S_N}{S_1} + \text{Log}\frac{Se_N}{Se_1} \right) - De$$

In which De is the known molecular diffusion coefficient of the standard substance, under these conditions, calibration is obtained in a simple manner.

Thus, in a living tissue two displacement phenomena occur. A first phenomenon is due to the molecular diffusion, as pointed out up to now. A second phenomenon is due to the micro-circulations in the tissues and mainly result from vascularization. These micro-circulations disturb the molecular diffusion image. Furthermore, in a variant the invention is performed by modulating the effect of the speed of the moving parts (the blood) of the tissue according to a modulation process described hereinafter, which makes it possible to modulate the effect (on the resonance signal) of these microcirculations. In this modulation process it is known that, by adding so-called compensating bipolar gradients, the image of the molecules of the blood is taken into account as if they where fixed. Under these conditions the diffusion phenomenon appears alone. This modulation process has previously been described in French patent application 85-12352, filed on Aug. 13, 1985. The content of this earlier-dated application now forms an integral part of the present invention.

For the thus made improvement, it is possible to explain that the micro-circulations (with slow movements) disturb the diffusing sequences due to the sufficiently marked sensitization gradients of said sequences. Thus, in a preferred manner, it is the diffusing sequences which are compensated. The question arises as to how it is possible to know that this compensation, sought because it neutralizes the undesirable effect of the micro-circulations, does not at the same time neutralize the diffusion effect. The inventors of the present invention think that this non-neutralization is due to an incoherent time distribution of the molecular diffusion displacements. However, the micro-circulations are coherent displacements, because their speeds are quasi-constant. In other words, the reduction of the resonance signal measured during a diffusing sequence (compared with that measured during a non-diffusing sequence) is now due solely to the diffusion and not also to the micro-circulations, whereof the effect has been neutralized.

The improvement relates to a process for modulating the effect of the speed of moving parts of a body in a density measurement by nuclear magnetic resonance (NMR), as well as to the performance of the process for deducing therefrom the speed of the moving parts in question. The improvement is more particularly used in the medical field, where the bodies examined are human bodies and where the moving parts are cells of the blood circulating in the veins and arteries, or moving organs such as the cardiac muscle. In this application, the improvement can be more particularly realized with an imaging or image production process in order to give an image representing the distribution of the speeds of the moving parts in a section of the body examined.

During a resonance experiment, if the orienting field $B_O$ is perfectly homogeneous, in response, mobile particles in a considered region emit a signal identical to that of the fixed particles of said region. However, if the orienting field is not homogeneous, or, more generally if for various reasons (particularly for carrying out image formation) during or after radio frequency magnetic excitation, an interfering magnetic field is applied which has an intensity gradient, it is possible to show that the contributions made by the mobile particles in the overall signal emitted are affected by a phase component dependent on the speed thereof. This can be easily understood. The resonant signal emitted vibrates at a frequency $f_O$, which is dependent on the intensity of the orienting magnetic field $B_O$ and the gyromagnetic ratio characteristic of the medium in question $\gamma$. All variations in the intensity of the field $B_O$ consequently lead to a corresponding variation of the resonant frequency. Consequently a fixed particle which, following radio frequency excitation, is exposed firstly to the field $B_O$ resonates at a frequency $f_O$ and then secondly is exposed to a stronger field $B_O + \Delta B_O$, resonates at a higher frequency $f_O + \Delta f_O$. Thirdly it is again exposed to field $B_O$ and it again vibrates at frequency $f_O$. During the latter the signal emitted is then phase displaced with respect to its phase initially. This phase displacement is proportional to the amplitude of the interference $\Delta B_O$ and to the duration of said interference. If all the particles of the medium are fixed on or if the interference which has reached all the medium does not have a gradient, this simply means that the overall signal emitted is delayed.

However, the procedure is quite different in the case of particles having a certain speed when the interference has a gradient. During three periods and as a result of the displacement speed thereof during these periods, they occupy regions in space where the orienting and interfering fields differ. They differ respectively as a result of the existence of inhomogeneities or the fact that gradients exist. Therefore the contribution of the mobile particles in the signal is provided with a phase dependent not only on the amplitude of the interference encountered (as for fixed particles), but also the amplitude variation of said interferences along the path which they have taken. This variation, which constitutes the gradient is geographically imposed. Consequently the phase displacement of the signal of the mobile particles is then dependent on their speed, because the higher their speed the more regions in space they occupy. If the displacement speeds, inhomogeneity or field gradients are too large, the phases of the different contributions can be affected to this point that they end up by providing opposition. In this case, these contributions are mutually cancelled out and the resulting overall signal is not as strong. In practice this effect is such that it often gives the illusion that there is no matter in a body at the location where the mobile particles circulate.

To reveal the existence of mobile particles and to measure their characteristics, the density and possibly the displacement speed, it is possible to proceed in accordance with a method described by E. L. HAHN in February 1960 in the Journal of GEOPHYSICAL RESEARCH, vol. 65, no. 2, p. 776 ff. The author suggests subjecting the medium in question to a sequence of a particular gradient and coding it. The principle of this coding consists of applying following the flipping of the radio frequency pulse, a bipolar gradient along the axis of a velocity component which it is wished to recognize. A bipolar gradient is such that its time integral is zero from the time corresponding to the start of the radio frequency pulse to the time corresponding to the measurement. The magnetic moment of the spin of a stationary particle in this case only undergoes a zero overall phase displacement. Thus, the phase displacement undergone during the application of the first part of the bipolar gradient is compensated by the application of the second part of said gradient. However, a mobile particle with a positive speed along the gradient axis then undergoes during the second part of the pulse, a larger phase displacement in absolute values than during the first part. The reason is that during this second part, it frequents a region in space where, due to the gradient, the interfering magnetic field is stronger. By comparing a measurement made with such a bipolar gradient and a measurement made without it being applied, it is possible to deduce therefrom the speed and number of mobile particles.

Whatever the objectives pursued, simple measurement or measurement with an image and no matter what the procedures adopted, the sensitivity of the speed phenomenon to the interfering magnetic field applied is such that the displacement phenomena can only be revealed when the maximum speeds are below a limit. Particularly in image formation, depending on whether the velocity component to be revealed is parallel or perpendicular to the plane of the imaged section, the sensitivity of NMR machines is at present approximately 1 radian (cm/s) to 0.2 radian (cm/s). This means that a particle moving at 1 cm/second in the plane of the section contributes to the overall signal emitted with a phase displacement of 1 radian compared with the contributions emitted by the fixed particles. In the human body a nominal blood circulation speed of 50 cm/s is reached at present, whereby it can even be several meters per second in the heart. Moreover, the distribution of the speeds in a vessel ranges between zero on the edges of the vessel and nominal speed at the centre of the vessel. Thus, each particle of a vessel contributes to the signal with a phase displacement which can be zero to 50 radians. Knowing that contributions phase displaced by $\pi$ radians mutually oppose one another, the resulting signal is zero, which amounts to taking the mean value of a sinusoidal signal over several periods or cycles. For example, Paul R. Moran in an article in Radiology of RSNA, 1985, 154, pp. 433–441 refers to a measurement of a mean speed equal to 0.6 cm/s and corresponding to a phase displacement of approximately 90°. Beyond this limit, the sensitivity of the machines is too great and the speeds can no longer be measured.

The object of the improvement is to reveal the effect of the speed of the moving parts of a body by modifying the sensitivity of the machines in a particular manner. The sensitivity modification, whilst not modifying in any way the signals emitted by the fixed parts, can have the effect of cancelling out the phase displacement part due to the speed. The moving particles then contribute to the overall signal in the same way as if they were fixed. The process according to the improvement also makes it possible to modulate the effect of the speed, instead of cancelling everything out. By carrying out two measurements with different modulation characteristics and by comparing the two measurements, it is possible to eliminate influence of the fixed parts, so that only that of the moving parts appears. In this comparison, the moving parts appear weighted by the modulation characteristics of the two experiments. In the invention, these characteristics can be calculated and the speed effect can be quantified.

The principle given in the process according to the improvement is very general, not being confined to a particular imaging application. It can in particular be realized with resonance spectrometers. Moreover, it is applicable no matter what the radio frequency excitation procedures adopted are and these can be e.g. saturation recovery, inversion recovery, double saturation recovery, saturation recovery-inversion recovery, spin echo, etc. Within the scope of image formation, the invention is applicable no matter what the image formation procedure adopted, e.g. no matter whether it is an overhead projection method of the P. C. Lauterbur type, a Fourier transform method of the 3 DFT or 2 DFT type developed by A. Kumar and R. R. Ernest, or its variant known as spin warp (the improvement being described with respect to this second method), an image formation method of sensible volumes developed by W. F. Hinshaw, or a fast acquisition method developed by P. Mansfield and known as the echo-planar method, etc. Thus, in all the situations implied by these procedures, the modulation is possible, because it consists of modifying the interfering magnetic fields (the field gradients) by adding thereto compensating magnetic fields of a similar configuration and whereof the shape, duration and amplitude characteristics are dependent on said interfering magnetic field. The present improvement specifically relates to a process for the modulation of the speed effect of the moving parts of a body in a density measurement by nuclear magnetic resonance for which the body is exposed to an orienting, constant magnetic field for orienting, in a single direction, the magnetic spin moments of the body, said body is subjected to a radio frequency magnetic excitation in the presence of and/or followed by the application of a sequence of an interfering magnetic field—and a magnetic resonance signal emitted in response by the body is taken, wherein the effect of the speed of the moving parts of the body created by the sequence of the interfering field is modulated by the application prior to the reading, of a sequence of a compensating magnetic field, whereof the integral calculated on its duration is zero and whose history and value are a function of the history and value of the interfering field.

The improvement also relates to the performance of the process, wherein it is firstly performed for compensating the speed effect and on a second occasion by modifying one or more of the characteristics of the compensating magnetic field and comparing the measurements obtained in the two performances in order to deduce therefrom the speed of the moving parts in question.

Figure 4:
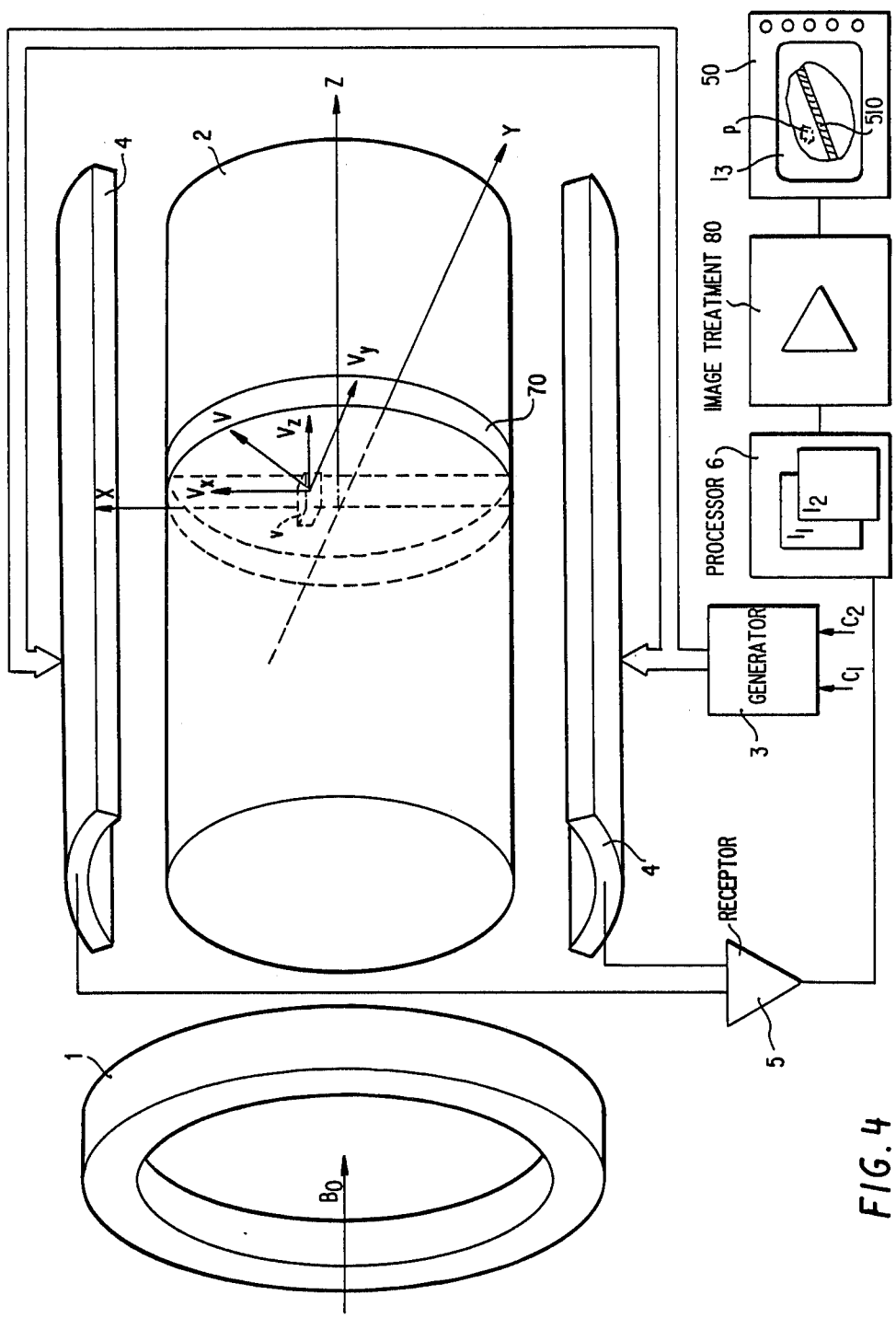
FIG. 4. a machine for realizing in the invention a modulation process according to an improvement.
Figure 5:
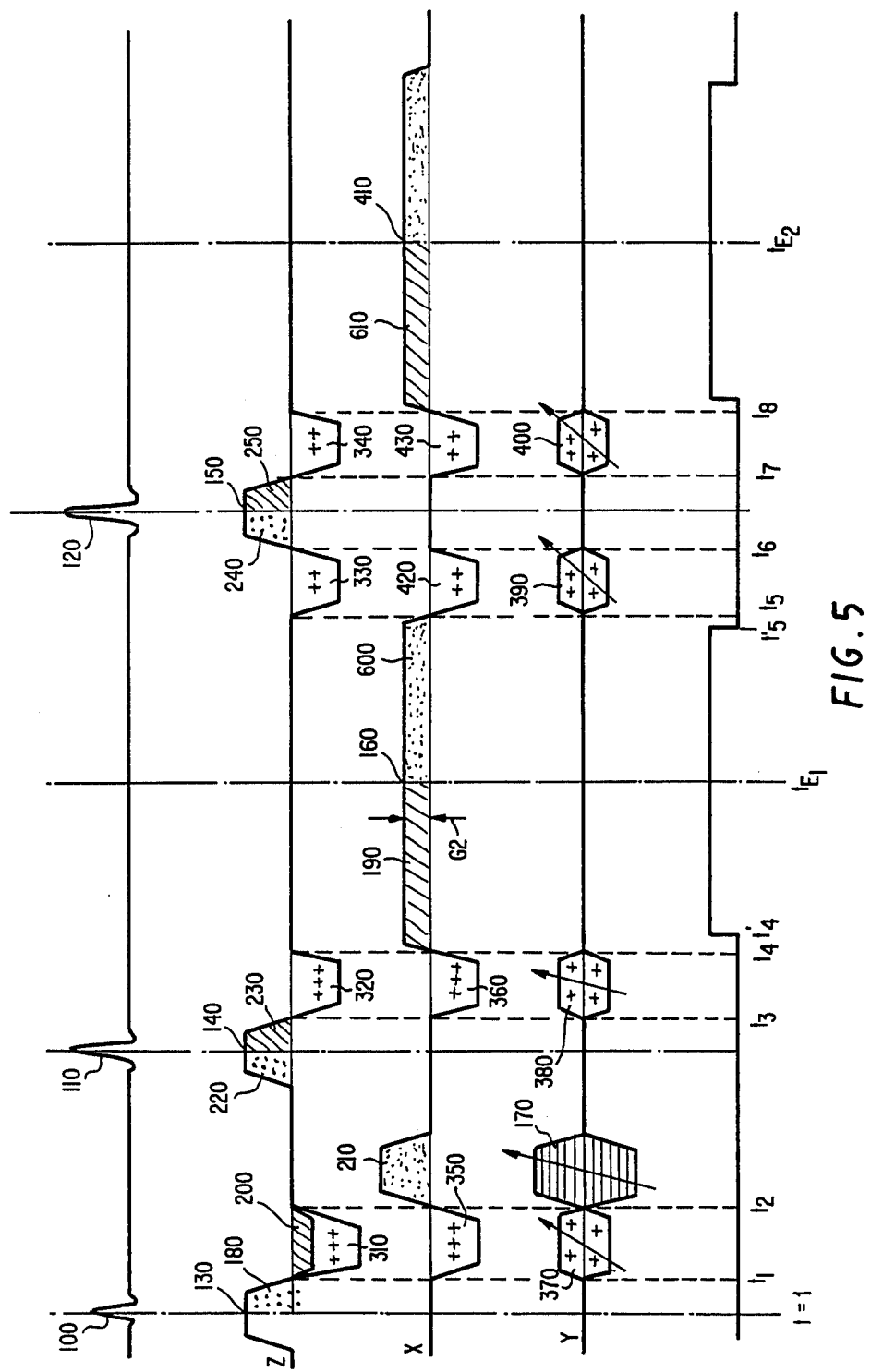
FIG. 5. time diagrams of radio frequency excitation signal, interfering magnetic field signals and signals recorded in a special measurement involving type 2 DFT imaging of a section of a body being examined.

FIG. 4 shows a machine usuable for performing the process according to the improvement. It has means symbolized by a coil 1 to subject a body 2 to a constant, strong magnetic field $B_O$. Field $B_O$ is the orienting field. The machine also has generator means 3 and coils 4, connected to the latter for subjecting the thus positioned body to radio frequency excitation sequences in the presence of interfering field sequences: field gradients oriented in accordance with three reference axes of the machine X, Y or Z (FIG. 5). At the same time coils 4 represent the radio frequency coils and the field gradient coils. The machine also has reception means 5 connected to coils 4 for receiving the magnetic resonance signal. In an image formation application, means 6 can make it possible to calculate and store a first image $I_1$ and a second image $I_2$ on a section 70 of a body 2. The two images relate to two experimentation series imposed by symbolized controls $C_1$ and $C_2$ of generator means 3. Pointwise comparison takes place in comparison means 80 of the images $I_1$, $I_2$ and a third image $I_3$ is produced. It is possible to display image $I_3$ on a display means 50.

In images $I_1$, $I_2$ or $I_3$, an image or picture point p conventionally represents by its brightness the density of the particles contained in a volume element v coresponding thereto in section 70. The volume element v has numerous particles moving at speeds V having components $V_x$, $V_y$ and $V_z$ on each of the three reference axes of the machine. The invention will make it possible to calculate in volume element v and also in all other volume elements, the mean speed or velocity and the number of particles of said moving volume element. Image $I_3$ represents said speed information by comparison between two images $I_1$ and $I_2$, in which the effect of said speed would be modulated in two different ways.

Firstly, brief reference will be made to the theory of image formation by a type 2 DFT method, in which there are interfering gradients as in all the other methods. Details will then be given as to why this method is preferable in view of the inhomogeneity problems of the orienting field. Finally, details will be given as to how the compensating fields necessary for modulating the speed effect are calculated.

In order to locate a region in a medium, it is necessary to reference the nature of its emission as a function of the local conditions of magnetic field. These local conditions are imposed in such a way that the emission phase and the frequency are characteristic of the location in space of said region of the medium. For this purpose, on the main field $B_O$ are imposed pulsed magnetic field gradients. These gradients are oriented in directions X, Y and Z to define at all times the volume elements which resonate at known frequencies. For the acquisition of a whole image or picture. the local conditions are imposed in programmed sequences ($C_1$, $C_2$). The latter are stored in a master computer. These sequences define the application times of the gradients, the excitation times of the particles by the radio frequency field pulses and the reading or acquisition times of the image data.

The image formation method 2 DFT makes it possible at present to obtain the best picture quality. In this method, only one sectional plane 7 is excited at once. FIG. 5 shows for this purpose the radio frequency pulses 100, 110, 120 applied in the presence of a so-called selection field gradient, e.g. oriented along axis Z and respectively represented by pulses 130, 140 and 150. When the selection gradient is oriented along axis Z the section is transversed, i.e. along a plane X, Y. In 2 DFT image formation, the different signals acquired are coded in phase. This is obtained by a variable intensity pulse of a so-called phase displacement gradient, whose axis is perpendicular to a so-called reading gradient, whose direction is constant. For example, for a transverse or cross-section, the reading gradient can be on axis X and the phase displacement gradient on axis Y. In FIG. 5 gradient X is 160 and gradient Y is 170. By a double spatial Fourier transform, the image is reconstructed, hence the name of the method. An improvement to this method can also make it possible to simultaneously obtain images of several parallel planes.

The existence of the precoding 170, which takes a certain time, pushes back in time the measurement of the signal emitted by the body. As this signal attenuates very rapidly, it was decided to measure an echo thereof, which is produced at the time of applying the radio frequency pulses 110 and then 120 by a reflection of the phase dispersion of the contributions made by each of the particles. For this reason these pulses are shown higher in FIG. 5 than pulse 100 because they lead to a flipping of the orientation of the magnetic moments of spins of particles by 180°, whereas pulse 100 only leads to a 90° flip thereof. In order to image a section of the body, spin echo excitation sequences must be performed in the presence of field gradient sequences on a sufficient number of occasions to ensure that the resolution of the expected image is more precise. For each excitation sequence, the phase displacement gradient Y varies by successive steps starting from a certain value and extending to the same value but of the opposite sign. This value is dependent on the shape and duration of the reading gradient 160. Phase displacement gradient makes it possible to rotate each magnetic spin movement by a variable phase, dependent on its ordinate along axis Y and of the value of said gradient. For each image $I_1$ and $I_2$, the gradient Y can successively assume the same and $I_2$, the gradients Y can successively assume the same number of values and in a preferred manner the definition of the two images is the same.

In order to avoid a parasitic precoding imposed by the end 180 of pulse 130 for the part of said pulse existing after the end of the radio frequency pulse 100, and by the start 190 of the reading pulse 160, it is known to respectively apply pulses 200, 210 to these axes. The time integral of these pulses is the same, but of opposite sign and they neutralize the parasitic coding effect. The integral is understood in the integral sense in time. Thus, the hatched surfaces 200 and 190 are equal to the dotted surfaces 180 and 210 respectively. Pulses 200 and 210 do not interfere in the section selection, because at the time when they are applied, pulse 100 is no longer present. Pulses 140 and 150 are autoneutralized, because they have respective portions 220, 230 and 240, 250 which are antisymmetrical with respect to the medium of the radio frequency pulses 110 and 120 for which they reselect the section 70 in body 2.

The 2 DFT type image formation method is the most widely used in practice, as a result of its acquisition speed (compared with 3D methods) and its robustness with respect to imperfections of the physical system and in particular with respect to inhomogeneities of the orienting field. This can in particular be appreciated by comparison with overhead projection methods, or with methods not using spin echo. However, this method is also the most intrinsically sensitive to the displacement of the particles. The immunity to the inhomogeneity of the field $B_0$ of the 2 DFT method results from the fact that, unlike overhead projection methods, the frequency coding gradient is of the same direction (reading gradient X) and the same amplitude $G_L$ from one sequence to the next. The inhomogeneity of the field $B_0$ only deforms the isofrequency resonance lines. During the reading of the signal, the inhomogeneity of the field becomes equivalent to a poor linearity of the gradient. Thus, the images are distorted, but do not lead to fuzziness or loss of resolution, which are encountered with overhead projection methods. In the latter, the reading gradient changes orientation for each sequence and consequently it distributes the inhomogeneities of the orienting field throughout the image, so that is leads to fuzziness.

FIGS. 6a and 6b show the phase displacement $\Delta \tau$ resulting in the contribution of the signal emitted by two particles of a same volume element exposed to identical interferences, when one of the particles (continuous line) is stationary, whereas the other particle (broken line) has a speed V. FIG. 6 shows the time diagram of a radio frequency signal RF having a pulse 260 for producing a spin echo. Along an axis A, a magnetic field gradient has been imposed by taking before and after pulse 260, e.g. a value G during a period $\theta$ on each occasion. At a given place $l_0$, a previously excited, stationary particle vibrates at a frequency $f_0$ at the start of the application of pulse 270. For the duration $\theta$ of said pulse 270 it vibrates at a different frequency. For example, said frequency is higher, so that at the end of pulse 270 as it restarts to vibrate at frequency $f_O$, it can be considered that it has undergone a phase displacement $\phi_1$. During the application of the radio frequency pulse 260 it can be accepted that everything takes place as if the phase of the signal emitted by said particle was inverted, i.e. $-\phi_1$. During pulse 280 which has exactly the same configuration as pulse 270 the phase displacement phenomenon continues, so that the contribution is phase displaced by $\phi_1$ again. However, this latter phase displacement cancels out the effect of the first after having been reversed or inverted by pulse 260. Consequently, the stationary particle at $l_0$ re-assumes at the end of pulse 280 the phase which it had at the start of pulse 270. It is worth pointing out that the phase displacement $\phi_1$ is proportional on the one hand to the amplitude of gradient G and on the other to the time during which each pulse of the gradient is imposed. More generally $\phi_1$ is proportional to the integral of said gradient during the existence time of its pulse, if said pulse is not exactly rectangular.

The situation is very different for a second particle, which is close in the same volume element of the preceding particle and which was successively located in positions $l_0$ to $l_4$ at the start and finish of the first pulse 270, at the time of the radio frequency pulse 260, and at the start and finish of the second pulse 280 of the gradient. Following the second gradient pulse 280 the resulting phase displacement $\phi_2$ is proportional to the gradient G and to the time $\theta$. However, it is also proportional to the distance $l_1-l_0$ traversed in the interval by the particle. This distance is equal to $V.\theta$. Thus, the time now intervenes to the square: the first phase displacement portion has the configuration of a parabola (V.G.$\theta^2$). From the end of pulse 270 to the start of pulse 280 everything takes place as for the stationary particle: the contribution has a phase $-\phi_2$ at the start of pulse 280. During said pulse 280 the evolution of the phase is also parabolic as for pulse 270. It could be expected that the phase effects would also cancel one another out here. However, between the end of pulse 270 and the start of pulse 280 the moving particle has moved from position $l_1$ to position $l_3$. In the latter position, at the time when pulse 280 appears and due to the existence of the field gradient, the local field conditions are no longer the same as those which prevailed when the particle was between $l_0$ and $l_1$. Consequently, at the end of pulse 280 compensation no longer takes place and this moving particle then emits a signal phase displace by a value $\Delta\phi$, which can be written as follows:

$$\Delta\phi = \gamma.G(\theta).V.T$$

in which $\gamma$ is the gyromagnetic ratio of the particles in question and $G(\theta)$ represents the gradient in pulses 270 and 280 and in which T is the duration separating the appearance of these two pulses. If $\theta$ is not small, T measures the duration between the centres of these pulses. More generally it is possible to write:

$$\Delta\phi(t) = V \cdot \int_0^t \gamma \cdot G(\tau) \cdot \tau \cdot d\tau$$

in which the phase displacement is now given as a function of time and in which $G(\tau)$ represents all the interferences applied to the particles prior to the measurement of the signal emitted by them at time or datum t. It must merely be borne in mind that the interferences in question are such that:

$$\int_0^t G(\tau)d\tau = 0$$

It is under this condition that, in a manner known in the art (FIG. 5, pulses 180 to 250), that the interfering or parasitic precodings have been compensated. This was obviously not carried out for the variable pulse 170 because the phase displacement caused by it for the overall signal is, between the individual acquisitions, one of the characteristics permitting image formation.

In the absence of a radio frequency pulse such as 260 producing a spin echo (FIG. 6b), pulses 270 and 280 of the bipolar gradient must be replaced by pulses 290 and 300 of opposite signs. In the same way, the phase for the fixed particles changes up to $\phi_3$ at the end of pulse 290 and changes in the reverse direction to zero during the reverse pulse 300. The phase displacement $\Delta\phi$ between the contribution of the mobile particles and that of the fixed particles is of the same order as hereinbefore.

In the expression of $\Delta\phi(t)$, $G(\tau)$ consequently represents all the sequences required by the measurement. What characterizes the improvement is not these sequences, but their effects on the speed which are compensated by the addition of supplementary sequences of so-called compensating field gradients G', such that:

$$\int_0^t (G(\tau) \cdot \tau + G'(\tau) \cdot \tau)d\tau = 0$$

In which G' represents also bipolar gradients, i.e. such that:

$$\int_0^t G'(\tau)d\tau = 0$$

in other words, by acting in this way it is possible to cancel out the multiplying coefficient of the speed V, which appears in the calculation of $\Delta\phi(t)$. Now, no matter what this speed, $\Delta\phi(t)$ is zero and all the contributions are in phase. The mobile particles are taken into account as if they were fixed.

However, it is pointed out that only the modifications of the signals due to the constant speeds V during the measurement are cancelled out in this way. This is in particular the case for the micro-circulations of the blood cells. However, with the diffusion, the speed of the protons during the same sequence ($NT_{E'}$, $T_E$) is not constant. Thus, the term V cannot be taken out of the expressions $\Delta\phi$. The compensation of G by G' cannot be produced. Under these conditions, the attenuation of the resonance signal due to the diffusion persists. It is measured and its measurement makes it possible to differentiate the investigated medium. It should be noted that the micro-circulation phenomenon is more particularly present in angiomas and tumors, hence the interest of eliminating these effects for correctly measuring the diffusion. Moreover, it is possible to quantify the intensity of the micro-circulations by comparing a diffusion image which has not been speed-compensated with a speed-compensated diffusion image. Thus, the first image is a diffusion and micro-circulation image, whereas the second image is a pure diffusion image. If their characteristics are equal, the subtraction of the two images leads to a micro-circulation image.

On returning to FIG. 5 it is possible to see on each axis X, Y and Z, the addition of such compensating bipolar gradients in the preferred form of pulse pairs designated 310 and 320, 330 and 340, 350 and 360, 370 and 380, 390 and 400 and 420 and 430. The influence of these compensating pulses is symbolized in the drawing the presence of small crosses. It is known to impose such pulses in the prior art machines by modifying controls $C_1$ or $C_2$ of the generator means. The time integral of the pulses of each pair is zero. In a preferred manner, because the precoding correction pulse 200 on the selection axis Z is applied between times $t_1$ and $t_2$ at the end of pulse 130 pulse 310 is applied during the same period and in this case the "new" pulse 200 is stronger. Pulses 350 and 370 are also applied during this period. In a preferred manner, pulses 320, 360 and 380 are applied between the end $t_3$ of pulse 140 and the start $t_4$ of reading pulse 160. Pulses 330, 390 and 420 are applied between the end $t_5$ of pulse 160 and the start $t_6$ of pulse 150. Pulses 340, 400 and 430 are applied between the end $t_7$ of pulse 150 and the start $t_8$ of a pulse 410 which is used for reading a second echo.

From the practical standpoint, the measurement of the emitted signal is carried out between $t'_4$ and $t'_5$ contained in $t_4$ and $t_5$ and also during the duration of pulse 410. Obviously the compensating pulses applied to an axis X, Y and Z have the effect of cancelling out the action of the interfering gradients applied to the same axis. The integral expression implicitly gives the gradients G' and simplifications are possible. Firstly all the terms in $G(\tau).\tau$ are known terms (belonging to the sequence 2 DFT), so that this also applies to their integral, which can consequently be removed from the expression. In a preferred manner, the shapes of the compensating pulses 310 to 430 will be known and, as far as possible, identical to already used shapes for normal pulses of the interfering sequences. Bearing in mind the time retained for the application of these pulses, a unitary integral of each can be calculated and the expression of G' can be written in another way:

$$\int_o^t G(\tau) \cdot \tau \cdot d\tau + \lambda \int_o^t \Gamma(\tau) \cdot \tau d\tau - o = 0$$

The first term is known and relates to the interfering gradients. The second term comprises gradient integrals of preferred form $\tau$ and of unity amplitude. It is known to calculate the integral of the second term, because the chosen form $\tau$ is known. Consequently, it is possible to deduce $\lambda$ therefrom, i.e. the amplitude of the compensating pulses.

In the case of conventional image formation, where at least one gradient is applied during the reading period ($t'_4$, $t'_5$), the implicit equation containing G' cannot be proved for all t. However, it must at least be proved at times $t_{E1}$ and $t_{E2}$ which form the centre of the measurement phases and being the times at which the expected spin echo is strongest. They are such that the time separating the time of the radio frequency pulse 100 and $T_{E1}$ is double the duration between pulse 100 and pulse 100 and such that the time between times $T_{E1}$ and $T_{E2}$ is double the time between $T_{E1}$ and the time of the radio frequency pulse 120. The justification for these times is on the one hand intuitive and on the other hand theoretical. The guiding idea in this field is that one wishes to know the state of section 70 not at the time of its excitation (pulse 100) but at the time $t_{E1}$ or $t_{E2}$ at which the measurement is performed, i.e. at the centre of the emitted signal.

All the terms of the implicit equation giving G' are known, so that G' can be calculated. FIG. 5 gives a simple approach for this calculation. For axis X, it is known that the pulses 210 and 190 on either side of the radio frequency pulse 110 mutually neutralize their precoding effects, the integral of the sum of these pulses being zero. However, the integral of the product of these pulses by the duration separating them from the time of reading $t_{E1}$ is not zero, pulse 210 being earlier in time than pulse 190. Thus, everything takes place as if the pulse 210 of given "force" is applied to a longer "lever arm" than pulse 190 of equal force. The effect on the phase of pulse 190 is obviously the reverse of that of pulse 210 because they are located on either side of pulse 110. Consequently, their common effect on the phase is analyzed as a moment oriented in the direction of the pulse having the greatest lever arm, i.e. pulse 210. It is appropriate to oppose this resultant moment by a pair of pulses 350 and 360 whose total integral is zero (leading to no phase displacement on the signal of the fixed parts), but whereof the overall moment is opposed to the overall moment of the two pulses 210 and 190. Thus, as pulse 350 is placed in time at a time preceding pulse 360 with respect to time $t_{E1}$, its effect is preponderant. It is of opposite direction to pulse 210.

In the same way on selection axis Z, of pulses 180, 200 and 220, 230 on each occasion it is pulses 180 and 220 which are preponderant, their lever arm being longer. Thus, pulse 310 must be in the same direction as pulse 200. The case of pulses 370 and 380 is slightly different. Thus, they must oppose the effects of the gradient varying between individual acquisitions. Thus, the amplitudes of pulses 370 and 380 will also vary correspondingly between individual acquisitions (symbolized by the arrows). For the preceding reasons, when pulse 170 is positive, pulse 370 must be negative. In order to be able to reduce the amplitudes of the compensating pulses, every effort is made to give the greatest effectiveness to their moment and attempts are also made to increase the duration separating their application from the date of the reading. They are placed as far upstream as possible of the sequence for the first (310, 350, 370) and as far downstream as possible for the second (320, 360, 380). In conclusion, they are as remote as possible on either side of the radio frequency pulse 110 and are as remote as possible from one another.

During the first reading at $t_{E1}$, the effects of the speed of the moving parts have been completely compensated. By means of pulses 330, 340 the effects of the second selection pulse 150 is now compensated for. The pivot time for calculating the moments is now $t_{E2}$. On reading axis X, there is also a compensation by two pulses 420, 430 of the effects of the second half 600 of pulse 160 and the first half 610 of pulse 410. The presence of the compensating pulses 390, 400 of axis Y is justified by the fact that the pulse 170 is not bipolar. This compensation of its moment at pivot time $t_{E1}$ by pulses 370 and 380 does not imply such a compensation at another pivot time, such as $t_{E2}$, even if no supplementary interfering pulse intervenes on said axis in the meantime.

FIG. 7 shows a sensed flow tube 510 in the examined section 70 of body 2. The top of the drawing shows a situation in which tube 510 is coplanar to plane X, Y of the section. In the bottom part of the drawing the situation differs, tube 510 being assumed as perpendicular to the plane X, Y of the section. Volume elements 520 to 550 are shown on either side and are in the form of rectangular parallelipipeds with a substantially square sectional shape. The section is square to the extent that, in image formation, the representative sampling is carried out with the same resolution along axis X and axis Y of the section plane. The major length of the rectangular parallelipiped extends along axis Z, said length being linked with the thickness of section 70. This thickness is an experimental compromise with the fineness of resolution of the sections and the measurable overall signal quantity. The thicker the section, the higher the measurable signal and obviously the less precise the image. In practice, the major dimension is approximately 7 to 15 mm and the square section approximately 1 mm×1 mm.

A not shown fluid circulates in pipe 510 with a speed diagram 560. The speeds 570 of the particles in the centre are higher than the speeds 580 of the particles located on the edges of the pipe. In the arteries, the speed 570 can be approximately 50 cm/s. When positioned perpendicularly to the section 590 of pipe 510 volume elements 520, 530 necessarily have particles moving at very different speeds. Before the invention, the spread of the speed spectrum was so high that the contribution of volume elements 520, 530 in the overall signal was zero, giving the impression that the tube was hollow. The image of the volume elements 540, 550 could, in certain cases, be revealing, as when, for example the volume elements were located perpendicular to that part of a section of the pipe where the spectrum of the speeds had a limited spread. This is the case for volume element 550 in which the speeds at the centre of the tube are both high and relatively homogeneous. Their corresponding phase displacement is substantially the same and the mean value is not zero. However, for the volume element 540 positioned straight below the edge of the pipe 510, at the point where the evolution of the speeds is sudden, the restored signal is zero. Thus, the image of tubes 510 perpendicular to the section plane appeared geometrically smaller than it was in reality. With the improvement, the image of the flows is faithfully revealed. In another area of improvement, it has been experimentally found that the compensation of the speed of the blood in the capillaries linked with the micro-circulation, so as to only reveal the diffusion phenomenon, was not always effective because the micro-circulation speeds in the tissue were not constant in value and direction during the measuring time (echo time). The direction constancy is linked with the geometry of the capillary system in the studied tissue. For example, the micro-circulation direction in a muscle can be constant (rectilinear vessels) over a distance exceeding the distance traveled by the blood during the measuring time. However, for other tissues, such as the human brain, the micro-circulation (sometimes also referred to as perfusion) is oriented in all directions. The entanglement of the systems of capillaries there is such that, despite the speed of the NMR measurements (an excitation-measuring sequence typically lasting 100 ms), the orientations of the displacement speeds of the molecules change direction during the measurement, which can be interpreted as a macro-diffusion at the scale of 1 volume element. In other words, the representation in the image of the diffusion parameter (D) of the tissue is falsified. The represented coefficient contains a component linked with the value of the true diffusion (D) for the static part of the tissue and a component (D′) linked with the presence of the micro-circulation in a given volume element.

If f is the fluid proportion circulating in the capillaries and (1−f) the proportion of the remainder of the tissue in a given volume element, it can be said that the measured signal contribution relative to said volume element can be written, in the case of a slightly diffusing sequence (not very sensitive to the diffusion and the micro-circulation phenomenon)

$$S_N = (1-f)S(\rho, T_1, T_2).A + f.S'(\rho, T_1, T_2).A \text{ (with N echoes, } N \geq 1)$$

and for a diffusing sequence $$S_1 = (1-f)S(\rho, T_1, T_2).e^{-b_{km}D} + f.S'(\rho.T_1.T_2).F_1.e^{-b_{km}D}$$

In these formulas $S(\rho, T_1, T_2)$ and $S'(\rho, T_1, T_2)$ represent the NMR signal respectively for the tissue (brain tissue) and for the fluid of active capillaries. The value $A = e^b Nm^D$ represents the effect of the diffusion during the first sequences (N,m). As the first sequences are slightly diffusing A equals 1 and is then ignored in the calculations. The function F, equal to 1 for the slightly diffusing sequences, has a value below 1 in the case of diffusing sequences. It is dependent on gradients, the speed of the blood in the micro-circulation and the geometry of the capillaries. When the mean distance for which a capillary can be considered as rectilinear is below the distance covered during the measuring time, it is possible to write:

$$F_1 = e^{-b_{km}.D'}$$

The micro-circulation is likened to a macro-diffusion $D'$.

In the other improvement provided, it has been found that $F_1$, linked with the micro-circulation, could be much smaller than $e^{-b_{km}.d}$ linked with the true diffusion D to be known. It is then ensured that $b_{km}$, which is dependent on the shape and force of the gradients in the diffusion sequence, is sufficient to make the attenuation $e^{-b_{km}.D}$ significant (to the point where D can be measured) and strong enough in order that $f.F_1$ may be considered as negligible. In a preferred example $b_{km}$ corresponds to k=1. The diffusing sequences preferably have a single spin echo (m corresponding to the number of pairs of compensated homologous gradients, also said to be bipolar, of the sequence). In this case, it is possible to say that the measured diffusion coefficient $D_m$ is, by applying the above formula given at the start of this description, such that:

$$D_m = \frac{1}{b_{km}} \cdot \text{Log} \frac{(1-f)S + fS'}{(1-f)Se - b_{km.}} D$$

Assuming that S is close to S′, it is possible to simplify by S (or S′) and the expression of $D_m$ becomes:

$$D_m = D - (1/b_{km}) \cdot \text{Log}(1-f)$$

This expression is an equation with two unknowns D and f, for which a solution can be found by reiterating the experiments so as to measure two values of Dm for two different values of $b_{km}$. D and f are extracted from the system of two equations with two unknowns obtained. The retained two values of $b_{km}$ also conform with the information given hereinbefore relative to the need for making $f.F_1$ negligible.

In other words, the novel process for taking advantage of this new improvement can comprise a first group of sequences of a first type (first slightly diffusing sequences), a second group of sequences of a second type (second diffusing sequences) and a third group of sequences of the second type (second sequences, which are also diffusing, but whose diffusion characteristics $b_{km}$ are changed). The first value of $D_m$ is taken from the comparison of the NMR signal resulting from the first group of sequences with the NMR signal resulting from the second group of sequences. The second value of $D_m$ is taken from the comparison of the NMR signal resulting from the first group of sequences with the NMR signal resulting from the third group of sequences. Thus, it is pointless to reiterate the first group of sequences. The true diffusion value D at each point is extracted from the system of two equations with two unknowns applicable for this point. It is known how it is possible to resolve such a system of equations. As a result of the process according to the invention, it is also possible to known f, or alternatively $1-f$, which amounts to the same thing. It should be noted that the knowledge of this parameter can also be of interest for establishing a diagnosis. Finally, two images are obtained, namely one for the two diffusion D and the other for the perfusion f (namely the proportion of the active capillaries in the tissue in each volume element). If appropriate, the diffusion sequences can also be speed-compensated, if a rectilinear component of the speed in the capillaries is noted. In this case, as a result of the compensation, $F_1$ becomes equal to 1.

It should also be noted that for the second and third groups of sequences (diffusing) $f.F_1$ is negligible. Thus, for these sequences, the value (form and force) of the gradients is adapted to this constraint. It is then possible to compare point-by-point, the NMR signal relative to said sequences, namely $S_1$ and $S'_1$ the relative signal at each point respectively to the second and third sequences, which can be written:

$$S_1 = (1-f)S(\rho,T_1,T_2)e^{-b_{km}D}$$

$$S'_1 = (1-f)S(\rho,T_1,T_2)e^{-b_{k'm'}D}$$

because the contribution of the micro-circulation in each volume element is negligible, so that:

$$S_1/S'_1 = e^{-(b_{km}-b_{k'm'})D}$$

From this is extracted the true D. Under these conditions, the micro-circulation interference is eliminated, whilst still having only two sequences, but which are diffusing sequences ($S_1$, $S'_1$) with different characteristics. Thus, when it is more particularly stated in the claims that the process of the invention has slightly diffusion sequences and diffusing sequences, all things being equal, this must be understood to mean less diffusing sequences and more diffusing sequences.

Three cases can occur. In the first case the capillaries of the tissue are rectilinear and parallel, giving the true diffusion image with a non-diffusing sequence and a compensated diffusing sequence. In the second case, the capillaries are not rectilinear and then the true diffusion image D or the perfusion f is obtained, with the three sequences (whereof two are diffusing) and there is no purpose in carrying out compensation. In the third case, the capillaries are rectilinear but all directions, so that the true diffusion image is obtained as in the first or second cases. The second case requires supplementary image acquisition (by varying $b_{km}$), which takes longer, but has the advantage of also proposing the perfusion image f.

What is claimed is:

1. A process for imaging by nuclear magnetic resonance, wherein it comprises the following stages for giving an image of the molecular diffusion of an investigated body:

the body is placed in a constant magnetic field $B_o$;

the thus positioned body is subject to a first plurality of first spin echo excitation sequences in the presence of first field gradient sequences, said first spin echo sequences having an integral number N equal to or greater than one excitations where the magnetic moments of the nuclei of the body are flipped by 180° following an excitation in which said moments have been flipped by 90° to obtain in this way sequences with N slightly diffusing echoes;

the magnetic resonance signals are recorded at the end of these first sequences and a first image is calculated corresponding to echo N of these signals by allocating to each point of the image a value corresponding to the magnetic resonance signal of the point corresponding thereto in the body;

the thus positioned body is subject to a second plurality of second spin echo excitation sequences in the presence of second field gradient sequences, said second spin echo sequences having at least one 180° excitation following a 90° excitation for forming diffusing sequences with at least one echo, the total echo durations of the second excitation sequences being equal to the total echo durations of the first excitation sequences;

the magnetic resonance signals are recorded at the end of said second excitation sequences and a second image is calculated corresponding to the echoes of these signals by allocating to each image point a value corresponding to the magnetic resonance signal of the point corresponding thereto in the body;

there is a point-by-point comparison of the values allocated for the first image with the values allocated for the second image, in order to produce a third image representing the molecular diffusion at each point of the body.

2. A process according to claim 1, wherein the second sequences have longer and/or more powerful field gradient pulses out of the presence of spin echo excitations and oriented according to one axis in order to form field gradient supplements.

3. A process according to claim 2, in which the field gradient sequences incorporate field gradient pulses oriented along three axes X, Y, Z, the axis Z of the constant $B_o$ or selection axis, as well as two axes X, Y orthogonal to said axis and respectively called phase coding axis Y and reading axis X, in which the method for calculating the images is of the 2 DFT type, wherein the axis of the supplements is the reading axis.

4. A process according to claim 2, in which the field gradient sequences incorporate field gradient pulses oriented along three axes X, Y, Z, the axis Z of the constant field $B_o$ or selection axis, as well as two axes X, Y, orthogonal to said axis and respectively called phase coding axis Y and reading axis X, in which the method for calculating the images is of the 2 DFT type, wherein the axis of the supplements is the selection axis.

5. A process according to claim 2, in which the field gradient sequences incorporate field gradient pulses oriented in accordance with three axes X, Y, Z, the axis Z of the constant field $B_o$ or selection axes, as wall as two axes X, Y, orthogonal to said axis and respectively called the phase coding axis Y and the reading axis X, in which the method for calculating the images is of type 2 DFT, wherein the axis of the supplements is the phase coding axis.

6. A process according to the claim 1, wherein it is performed on a number of occasions for forming third multisection images of the studied body.

7. A process according to the claim 2, wherein the application times of the gradient supplements are, within a same sequence, as timely spaced as possible before and respectively after the 180° radio frequency excitation time.

8. A process according to the claim 1, wherein a standard body is placed alongside the body to calibrate the calculations of the third image.

9. A process according to the claim 1, wherein the durations of the echo time $T_E$, of the first spin echo sequences are all equal to one another.

10. A process according to the claim 1, wherein N is equal to four.

11. A process according to claim 2, wherein the stages relative to the second image are modified with gradient supplements oriented along another axis in order to produce another third image for determining the nature of the imaged regions.

12. A process according to the claim 11, wherein the logarithm of the ratio of the values is calculated for comparison purposes.

13. A process according to claim 1, wherein the thus positioned body is subject to a third plurality of third spin echo excitation sequences in the presence of third field gradient sequences, the third spin echo sequences having at least one 180° excitation following the 90° excitation for producing diffusing sequences with at least one echo, the total echo durations of the third excitation sequences being equal to the total echo durations of the first excitation sequences, the third field gradient sequences differing from the second field gradient sequences; the magnetic resonance signals are read at the end of said third excitation sequences and a fourth image is calculated corresponding to the echoes of these signals by attributing to each image point a value corresponding to the magnetic resonance signal of the point corresponding thereto in the body;

the values attributed for the first image are compared point-by-point with the values attributed for the fourth image for producing a fifth image representing the molecular diffusion at each point in the body;

and then the values attributed for the third image are compared point-by-point with the values attributed for the fifth image for producing a sixth image representing the true molecular diffusion in the body and which is free from micro-circulation interference.

14. A process according to claim 1, wherein the thus positioned body is subject to a third plurality of third spin echo excitation sequences in the presence of third field gradient sequences, the third spin echo sequences having at least one 180° excitation following the 90° excitation for producing diffusing sequences with at least one echo, the total echo durations of the third excitation sequences being equal to the total echo durations of the first excitation sequences, the third field gradient sequences differing from the second field gradient sequences; the magnetic resonance signals are read at the end of these third excitation sequences and a fourth image is calculated which corresponds to the echoes of these signals by attributing to each image point a value corresponding to the magnetic resonance signal of the point corresponding thereto in the body;

the values attributed for the first image are compared point-by-point with the values attributed for the fourth image for producing a fifth image representing the molecular diffusion at each point of the body;

and the values attributed for the third image are compared point-by-point with the values attributed for the fifth image in order to produce a seventh image representing a perfusion phenomenon in the body.

15. A process according to claim 13 further comprising a step wherein the values attributed for the third image are compared point-by-point with the values attributed for the fifth image in order to produce a seventh image representing a perfusion phenomena in the body and wherein the sixth and seventh images are simultaneously produced.

16. A process according to any one of the claims 1 to 14, wherein the diffusing sequences are sequences with a single spin echo.

17. A process according to any one of the claims 11, 13 or 14 wherein the effect of the speed of moving parts of the body created by so-called interfering field gradient sequences is modulated by applying, before the record of the signal, a compensating magnetic field sequence, whose integral calculated on its duration is zero and whose history and value are a function of the history and value of the interfering fields.

18. A process according to claim 17, wherein the sequence of the interfering magnetic field incorporates magnetic field pulses along orthogonal axes X, Y, Z, and wherein the sequence of the compensating magnetic field incorporates magnetic field pulses along these three same axes, in order to modulate one by one the effects of the speed of the moving parts of the body along these three same axes.

19. A process according to claim 18, wherein the compensating magnetic field pulses are determined a priori in a form, in a duration, and in a position and wherein their amplitude λ is evaluated to obtain the sought modulation.

20. A process according to claim 17, wherein the sequence of the compensating magnetic fields incorporates bipolar pulses pairs.

21. A process according to the claim 17, wherein the sequence of the compensating magnetic fields has pulse pairs, each pulse of a pair having a value, shape, duration and signal equal to the other pulse of the pair, said pulses being respectively timely located before and after a second high frequency pulse.

22. A process according to the claim 17, wherein the integral of the product of the value of the interfering field pulses by the time separating them from the recording of the emitted signal as compensated by the integral of the same product obtained with compensating field pulses in lieu of the interfering field pulses.

23. A process according to claim 20, wherein the pulses of the pulse pairs comprise pulses which are as timely spaced as possible from one another.

24. A process according to the claim 17, wherein effect of the speed of the moving parts of the body produced solely in the second field gradient sequences is modulated.

* * * * *